United States Patent
Loscutoff et al.

(10) Patent No.: US 8,785,233 B2
(45) Date of Patent: Jul. 22, 2014

(54) SOLAR CELL EMITTER REGION FABRICATION USING SILICON NANO-PARTICLES

(71) Applicant: SunPower Corporation, San Jose, CA (US)

(72) Inventors: Paul Loscutoff, Castro Valley, CA (US); David D. Smith, Campbell, CA (US); Michael Morse, San Jose, CA (US); Ann Waldhauer, La Honda, CA (US); Taeseok Kim, San Jose, CA (US); Steven Edward Molesa, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 13/720,060

(22) Filed: Dec. 19, 2012

(65) Prior Publication Data
US 2014/0170800 A1 Jun. 19, 2014

(51) Int. Cl.
*H01L 31/028* (2006.01)
*H01L 31/0376* (2006.01)

(52) U.S. Cl.
USPC ......... 438/63; 438/96; 257/E31.047; 136/258

(58) Field of Classification Search
None
See application file for complete search history.

(56) References Cited

U.S. PATENT DOCUMENTS

| | | |
|---|---|---|
| 6,998,288 B1 | 2/2006 | Smith et al. |
| 2008/0121279 A1* | 5/2008 | Swanson ............... 136/258 |
| 2009/0139571 A1* | 6/2009 | Chen et al. ............. 136/258 |
| 2010/0147368 A1 | 6/2010 | Rubin |
| 2011/0041902 A1 | 2/2011 | Krokoszinski et al. |
| 2012/0060904 A1 | 3/2012 | Smith et al. |
| 2012/0266951 A1 | 10/2012 | Li et al. |

FOREIGN PATENT DOCUMENTS

WO WO-2012021750 2/2012

OTHER PUBLICATIONS

International Search Report and Written Opinion from PCT Patent Application No. PCT/US2013/046434 mailed Sep. 27, 2013, 9 pgs.

* cited by examiner

*Primary Examiner* — Zandra Smith
*Assistant Examiner* — Pamela E Perkins
(74) *Attorney, Agent, or Firm* — Blakely Sokoloff Taylor Zafman LLP

(57) ABSTRACT

Methods of fabricating solar cell emitter regions using silicon nano-particles and the resulting solar cells are described. In an example, a method of fabricating an emitter region of a solar cell includes forming a region of doped silicon nano-particles above a dielectric layer disposed above a surface of a substrate of the solar cell. A layer of silicon is formed on the region of doped silicon nano-particles. At least a portion of the layer of silicon is mixed with at least a portion of the region of doped silicon nano-particles to form a doped polycrystalline silicon layer disposed on the dielectric layer.

20 Claims, 4 Drawing Sheets

SOLAR CELL EMITTER REGION FABRICATION USING SILICON NANO-PARTICLES

TECHNICAL FIELD

Embodiments of the present invention are in the field of renewable energy and, in particular, methods of fabricating solar cell emitter regions using silicon nano-particles and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present invention allow for increased solar cell manufacture efficiency by providing novel processes for fabricating solar cell structures. Some embodiments of the present invention allow for increased solar cell efficiency by providing novel solar cell structures.

DETAILED DESCRIPTION

Figure 1A:
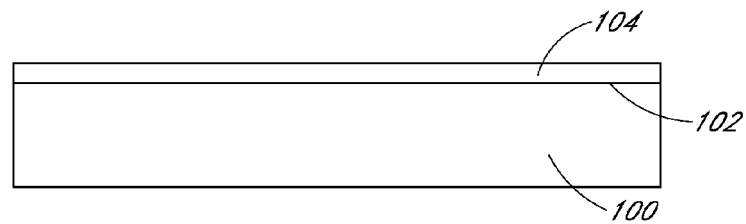
FIGS. 1A-1D illustrate cross-sectional views of various stages in the fabrication of a solar cell, in accordance with an embodiment of the present invention.

Methods of fabricating solar cell emitter regions using silicon nano-particles and the resulting solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithography and patterning techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of fabricating solar cells. In one embodiment, a method of fabricating an emitter region of a solar cell includes forming a region of doped silicon nano-particles above a dielectric layer disposed above a surface of a substrate of the solar cell. A layer of silicon is formed on the region of doped silicon nano-particles. At least a portion of the layer of silicon is mixed with at least a portion of the region of doped silicon nano-particles to form a doped polycrystalline silicon layer disposed on the dielectric layer.

In another embodiment, a method of fabricating an emitter region of a solar cell includes forming a region of doped silicon nano-particles above a dielectric layer disposed above a back surface of a substrate of the solar cell. The back surface is opposite a light-receiving surface of the solar cell. A layer of silicon is formed on both the light-receiving surface and above the back surface of the substrate, including a portion on the region of doped silicon nano-particles and a portion on the dielectric layer. The portion of the layer of silicon formed on the region of doped silicon nano-particles is mixed with at least a portion of the region of doped silicon nano-particles to form a doped polycrystalline silicon layer disposed on the dielectric layer. The layer of silicon on the light-receiving surface of the substrate, the portion of the layer of silicon on the dielectric layer, and an outermost region of the doped polycrystalline silicon layer are oxidized to form a silicon oxide layer on the light receiving surface and above the back surface of the substrate. An anti-reflective coating layer is formed on the silicon oxide layer on the light receiving surface and on the silicon oxide layer above the back surface of the substrate.

In yet another embodiment, a method of fabricating an emitter region of a solar cell includes forming a region of N-Type doped silicon nano-particles and a region of P-type doped silicon nano-particles above a dielectric layer disposed above a back surface of a substrate of the solar cell. The back surface is opposite a light-receiving surface of the solar cell. The region of N-Type doped silicon nano-particles is adjacent to but not in contact with the region of P-type doped silicon nano-particles. A layer of silicon is formed at least above the back surface of the substrate, including above a portion on the regions of N-type and P-type doped silicon nano-particles and a portion on the dielectric layer. The portion of the layer of silicon formed on the regions of N-type and P-type doped silicon nano-particles is mixed with at least a portion of each of the regions of N-type and P-type doped silicon nano-particles to form an N-type doped polycrystalline silicon layer and a P-type doped polycrystalline silicon layer, respectively, each disposed on the dielectric layer. The portion of the layer of silicon on the dielectric layer, and an outermost region of the each of the N-type and P-type doped polycrystalline silicon layers are oxidized to form a silicon oxide layer above the back surface of the substrate. The silicon oxide layer above the back surface of the substrate is masked and etched to provide an N-type doped polysilicon region and a P-type doped polycrystalline silicon region separated by a trench formed in the back surface of the substrate, each of the N-type doped polysilicon region and the P-type doped polycrystalline silicon region retaining a portion of the silicon oxide layer thereon. An anti-reflective coating layer is formed on the N-type doped polysilicon region and the P-type doped polycrystalline silicon region and in the trench.

In a first aspect, as an overview, polysilicon emitters can be formed by printing doped silicon nano-particles and subsequently depositing a thin amorphous silicon (a-Si) layer by low pressure chemical vapor deposition (LPCVD). Upon annealing the resulting structure at high temperature, the material stack densifies into a doped polysilicon layer, which can be used as a poly emitter for a solar cell. In one embodiment, one or both of the n-type and p-type emitters can be created with the nano-particles and directly patterned onto a substrate, as deposited. Such an approach can remove the need to drive dopants, pattern doped regions, or pattern a trench in between the emitters.

More generally, polysilicon emitters can be expensive to fabricate, often requiring several additional process steps relative to a substrate-emitter fabrication process. For example, a blanket deposition of polysilicon and subsequent deposition of dopant films typically requires several etch operations to fabricate patterned doped fingers and a trench between emitters. Several past attempts have been aimed at reducing the number of operations in such a process, such as the use of high lifetime polysilicon which can eliminate the need to fabricate a trench. Meanwhile, the use of inkjet dopants has allowed for direct patterning of dopants onto a polysilicon layer. Shadowmask plasma enhanced chemical vapor deposition (PECVD) of doped a-Si layers has also been used for operation-reduction process flows. By contrast, or in conjunction with the above approaches, embodiments described herein include the use of silicon nano-particle regions for forming emitter regions above a substrate, as described in greater detail below.

More specifically, in an embodiment, polysilicon emitters can be formed by first growing a tunnel oxide on a substrate surface and then printing both n-type and p-type silicon nano-particles onto the tunnel oxide layer. An a-Si layer is deposited by LPCVD, which fills in the voids between nano-particles. Upon annealing, the resulting blended film of Si nano-particles and a-Si material is densified to crystallize into a polysilicon layer. The dopant present in either the nano-particles or the LPCVD based a-Si, or both, can diffuse throughout the formed polysilicon layer. A thin layer of polysilicon may remain connecting the printed nano-particle emitters. In one embodiment, if this layer is problematic, an oxidation can be performed to convert the remaining polysilicon into an oxide film, removing electrical connections between the different emitters. Thus, in one embodiment, one or both of the n-type and p-type emitters are fabricated using nano-particles. The capability to print doped nano-particles can remove a need to drive dopant into the polysilicon layer, while the (as-deposited) patterning can remove the need to mask and etch the layers. Additionally, oxidizing the thin polysilicon layer between the emitters can remove a need to etch a trench between emitters. In a particular embodiment, the relatively slow and uniform deposition of a-Si by LPCVD is an excellent method for filling in voids between the nano-particles. Thus, a shear number of process operations in a fabrication process involving formation of emitter regions above a substrate, as opposed to within a substrate, can be reduced by as many as 2 through 8 process operations, examples of which are details below.

As an example, FIGS. 1A-1D illustrate cross-sectional views of various stages in the fabrication of a solar cell, in accordance with an embodiment of the present invention.

Referring to FIG. 1A, a method of fabricating an emitter region of a solar cell includes forming a thin dielectric layer 104, e.g., a tunnel oxide layer, on surface 102 of a substrate 100.

In an embodiment, the substrate 100 is a bulk silicon substrate, such as a bulk single crystalline N-type doped silicon substrate. It is to be understood, however, that substrate 100 may be a layer, such as a polycrystalline silicon layer, disposed on a global solar cell substrate. In an embodiment, the thin dielectric layer 104 is a layer of silicon oxide or silicon dioxide and is formed by consumption of a portion of an underlying crystalline silicon substrate 100 by, e.g., thermal oxidation, chemical oxidation, or UV/ozone oxidation. In another embodiment, the thin dielectric layer 104 is a layer of silicon oxide or silicon dioxide formed by liquid oxide deposition or other suitable deposition approach.

Figure 1B:
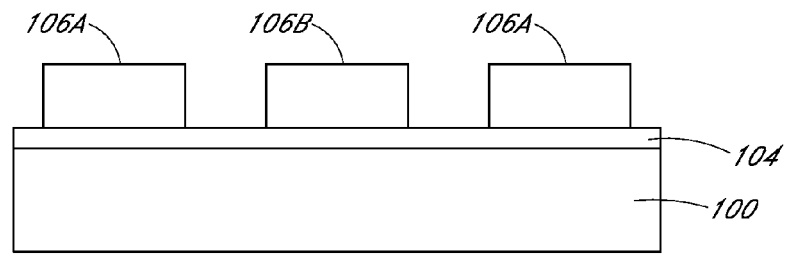

Referring to FIG. 1B, regions 106A and 106B of doped silicon nano-particles are formed on the thin dielectric layer 104.

In an embodiment, the regions 106A and 106B of doped silicon nano-particles are formed by printing (e.g., screen-printing, inkjet printing, nozzlejet printing, extrusion printing, or aerosol jet printing) or spin-on coating regions of doped silicon nano-particles having an average particles size approximately in the range of 5-100 nanometers and a porosity approximately in the range of 10-50%, with at least some open pores. In a specific embodiment, the doped silicon nano-particles are delivered in the presence of a carrier solvent or fluid which can later evaporate or be burned off. In an embodiment, when using a screen print process, it may be preferable to use a liquid source with high viscosity for delivery since using a low viscosity liquid may lead to bleeding, and hence resolution reduction of defined regions.

In an embodiment, both p-type doped regions (e.g., regions 106A) and n-type doped regions 106B are formed. The regions of differing dopant type can be formed as n-type regions first and p-type regions second, as p-type regions first and n-type regions second, or as p-type regions and n-type regions formed at the same time, e.g., in a single printing operation. In one embodiment, the p-type dopants are boron dopant impurity atoms, while the n-type dopants are phosphorus dopant impurity atoms. In an embodiment, each of the regions 106A or 106B of doped silicon nano-particles is formed to a thickness approximately in the range of 0.2-3 microns.

Figure 1C:
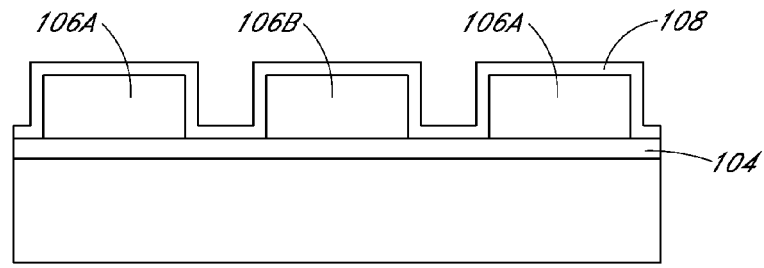

Referring to FIG. 1C, a layer of silicon 108 is formed on the regions 106A and 106B of doped silicon nano-particles.

In an embodiment, the layer of silicon 108 is layer of un-doped, intrinsic, or lightly doped amorphous silicon. In one such embodiment, the silicon layer 108 is formed from silane ($SiH_4$) in a low pressure chemical vapor deposition (LPCVD) chamber at a temperature approximately in the range of 525-565 degrees Celsius. In an embodiment, in the case that the regions 106A and 106B of doped silicon nano-particles include at least some open pores, at least a portion of the layer of silicon 108 is formed within the regions 106A and 106B of doped silicon nano-particles. In one such embodiment, the layer of silicon 108 closes one or more open pores of the regions 106A and 106B of doped silicon nano-particles with a portion of the layer of silicon 108. In a specific such embodiment, the one or more open pores of the regions 106A and 106B of doped silicon nano-particles are closed with resulting angular edges. In an embodiment, layer of silicon 108 is formed to an absolute thickness approximately in the range of 200-2000 Angstroms.

Although in one described example, an LPCVD based a-Si layer is used to fill in voids in the regions of nano-particles 106A and 106B, other methods such as APCVD or PECVD may be adapted to fill such voids. One or both types of the emitters (e.g., n-type and/or p-type) may be fabricated by this approach. Nonetheless, in another embodiment, LPCVD is used to deposit a thin layer of a-Si or poly-Si onto the thin dielectric layer 104. Since the layer is deposited by LPCVD, the deposition occurs throughout the nano-particle layer, filling in the porosity of the film. The deposited layer is, in one embodiment, thinner than the silicon nano-particle layer thickness, and itself can be could be deposited as a doped film, either p-type or n-type.

Figure 1D:
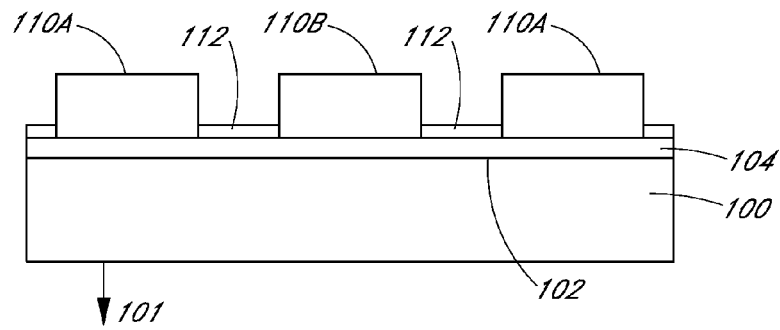

Referring to FIG. 1D, at least a portion of the layer of silicon 108 is mixed with at least a portion of the regions 106A and 106B of doped silicon nano-particles to form doped polycrystalline silicon regions 110A and 110B disposed on the dielectric layer 104. In one embodiment, in the case that regions 106A and 106B are p-type or n-type doped, respectively, polycrystalline silicon regions 110A and 110B are p-type or n-type doped, respectively. A remaining layer 112 of non-reacted (e.g., unmixed) portions of the layer of silicon 108 remains between the doped polycrystalline silicon regions 110A and 110B.

In an embodiment, the portion of the layer of silicon 108 is mixed with the portion of the regions 106A and 106B of doped silicon nano-particles to form the doped polycrystalline silicon regions 110A and 110B by heating the substrate 100 to a temperature approximately in the range of 700-1100 degrees Celsius. In an embodiment, mixing the portion of the layer of silicon 108 with the portion of the regions 106A and 106B of doped silicon nano-particles to form the doped polycrystalline silicon regions 110A and 110B reduces a combined thickness of the layer of silicon 108 and the regions 106A and 106B of doped silicon nano-particles by an amount approximately in the range of 20-50%. That is, the thickness of each of the regions 110A or 110B is approximately 20-50% less than the combined individual thicknesses of layer 108 and region 106A or 106B. In an embodiment, in the case that one or more open pores of the regions 106A and 106B of doped silicon nano-particles are closed with resulting angular edges, mixing the portion of the layer of silicon 108 with the portion of the regions 106A and 106B of doped silicon nano-particles to form the doped polycrystalline silicon regions 110A and 110B, respectively, includes modifying the closed pores having angular edges to ultimately result in rounded closed pores.

In an embodiment, the surface 102 of substrate 100 is a back surface of the substrate 100, opposite a light receiving surface of the substrate 100 (shown as direction 101 in FIG. 1D). In one such embodiment, subsequent to forming the doped polycrystalline silicon regions 110A and 110B, metal contacts are fabricated on the doped polycrystalline silicon regions 110A and 110B. The metal contacts may be metal contacts for a resulting back contact solar cell. In an embodiment, the metal contacts are formed by deposition, lithographic, and etch processing. It is to be understood that a variety of processing opportunities exist following fabrication of the structure of FIG. 1D, and prior to the actual fabrication of metal contacts to the doped polycrystalline silicon regions 110A and 110B. Examples of such fabrication opportunities are described below in association with FIGS. 2A-2C and 3A-3F.

In a second aspect, as an overview, the general emitter region fabrication scheme of FIGS. 1A-1D is used in conjunction with a process flow based on a high lifetime n-type wafer, pre-damage etch. As an example, a damage etch is combined with a single-side texturing of a front surface of a substrate. Meanwhile, oxidation of the back surface of the substrate is performed to fabricate a high quality tunnel oxide. The oxidation can be performed by, e.g., chemical oxidation, UV/ozone oxidation, or liquid oxide deposition. In one embodiment, an advantage of this approach includes the fabrication of a hydrophilic oxide on surfaces of a solar cell wafer, which may be preferred over a hydrophobic surface for maintaining clean wafer surfaces. The wafer can then be subjected to a double-print operation, where both n-type and p-type Si nano-particles are deposited on the surface in an appropriate pattern (e.g., as an embodiment described in association with FIG. 1B). The nano-particle deposition can be performed, e.g., by a two-stage screen printer, an inkjet printer, extrusion printer or an aerosol jet printer.

Next, the wafer can be loaded single-slotted into an LPCVD furnace. In the LPCVD furnace, an n-type a-Si deposition is performed (e.g., as an embodiment described in association with FIG. 1C). As described above, the a-Si layer can be used to fill-in the voids between particles for simplified polysilicon emitter formation. Upon annealing, the Si nano-particle/a-Si stack densifies and diffuses to form doped polysilicon emitter regions. If present, a small amount of n-type dopant from the a-Si deposition is diluted throughout the heavily doped p-type Si nano-particles, such that the polysilicon layer for p-type nano-particles remains p-type. A corresponding thin n-type polysilicon layer on the front surface can be used to act as a passivation layer for the front surface. Additionally, if the thin polysilicon layer between emitters (e.g., remaining portions 112 of FIG. 1D) allows for significant loss due to the junction with the p-poly emitter, an oxidation operation can be included to reduce the thickness of this thin poly layer. An oxidation operation can also be used to thin the poly silicon layer if there is a loss of transmission on the front surface due to the poly thickness. After annealing, the structure can be capped with an anti-reflective coating and moisture barrier, for example LPCVD silicon nitride.

Figure 2A:
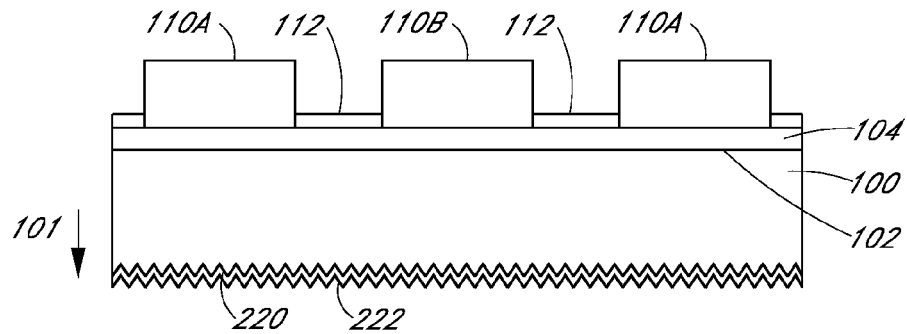
FIGS. 2A-2C illustrate cross-sectional views of various stages in the fabrication of a solar cell, in accordance with another embodiment of the present invention.
Figure 2B:
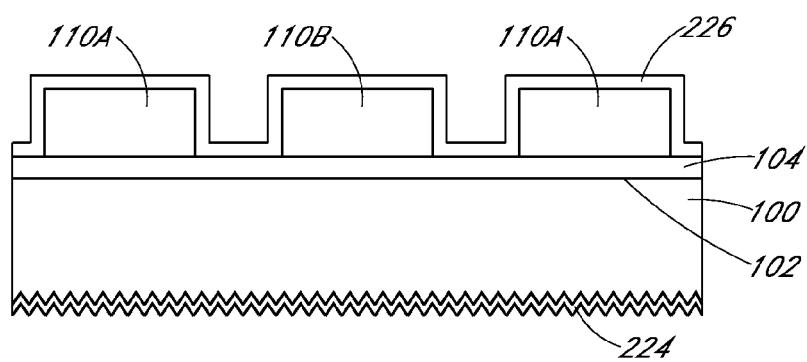
Figure 2C:
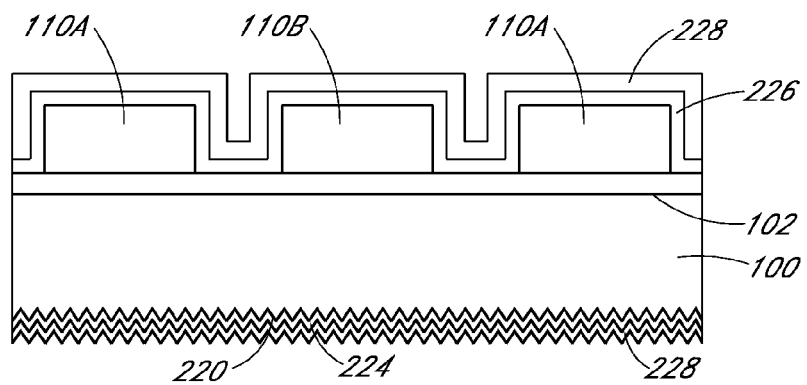

As an example, FIGS. 2A-2C illustrate cross-sectional views of various stages in the fabrication of a solar cell, in accordance with an embodiment of the present invention.

Referring to FIG. 2A, a process flow begins essentially with the structure of FIG. 1D, with some noted differences. The doped polycrystalline silicon regions 110A and 110B disposed on a dielectric layer 104, which is disposed on a surface 102 of a substrate 100 is as described in association with FIGS. 1A-1D. Furthermore, portions 112 of the silicon layer 108 remain from the emitter region fabrication process described above. In one embodiment, the polycrystalline silicon regions 110A and 110B are p-type and n-type doped, respectively.

However, in an embodiment, between the operations of FIGS. 1A and 1B, the front surface 101 of the substrate is texturized to provide a texturized surface 220, e.g., as a texturized light-receiving surface of a back contact solar cell. A texturized surface may be one which has a regular or an irregular shaped surface for scattering incoming light, decreasing the amount of light reflected off of the light-receiving surface of the solar cell. In one embodiment, the texturized surface is fabricated by etching performed by using a wet etch process such as an alkaline etch based on potassium hydroxide. In an embodiment, the thin dielectric layer protects the back side 102 of the substrate 100 during the etching. In another embodiment, however, the front surface is textured using a single-side texture process or tool.

Additionally, a layer of silicon 222 is formed on the texturized surface 220. The layer of silicon 222 can be fabricated in a same process operation as fabrication of layer 108, where compositions and methods of forming are as described above. Thus, referring again to FIG. 2A, a layer of silicon is disposed on both the light-receiving surface 220 (e.g., as layer 222) and on a portion of the thin dielectric layer 104, between the polycrystalline silicon regions 110A and 110B.

Referring to FIG. 2B, the layer of silicon 222 on the light-receiving surface 220 of the substrate 100, the portion 112 of the layer of silicon 108 on the dielectric layer 104, and an outermost region of the doped polycrystalline silicon regions 110A and 110B are oxidized to form a first silicon oxide layer 224 (which may be silicon dioxide) on the light receiving surface 220 and a second silicon oxide layer 226 (which may be silicon dioxide) above the back surface 102 of the substrate 100. In an embodiment, the silicon oxide layers 224 and 226 are formed by heating the substrate 100 in the presence of oxygen ($O_2$), water vapor ($H_2O$), or nitrous oxide ($N_2O$) in a low pressure chemical vapor deposition (LPCVD) chamber.

Alternatively, the operation of FIG. 2B may be omitted or reduced to partial oxidation, e.g., as may be sufficient to isolate the emitters formed from regions 110A and 110B. That is, oxidation of the thin polysilicon layer between emitters does not necessarily need to be complete. A thin layer of polysilicon could instead be grown epitaxially on the single crystal substrate, or may be resistive enough that lateral transport through the thin layer is not a dominant recombination method. The layer could also be partially oxidized to reduce conductivity to acceptable levels. If a doped a-Si layer is deposited by LPCVD, the doped poly silicon layer could act as a passivation film for the front surface and area on the back surface between emitters. Alternatively, if two emitters are not electrically isolated, the remaining thin poly silicon layer can be removed through oxidation and/or etch processing.

Referring to FIG. 2C, an anti-reflective coating layer 228 is formed on the silicon oxide layer 224 on the light receiving surface 220 and on the silicon oxide layer 226 above the back surface 102 of the substrate 100. In an embodiment, the anti-reflective coating layer 228 is a silicon nitride layer formed in a low pressure chemical vapor deposition (LPCVD) chamber. In an embodiment, formation of silicon layers 108 (and hence remnants 112) and 222, oxidation of remnants 112 and layer 222, and formation of the anti-reflective coating layer 228 are all performed in a single LPCVD tool, e.g., as a single pass in a chamber of the LPCVD tool. In an embodiment (not shown), a metal contact is subsequently formed to the doped polycrystalline silicon regions 110A and 110B, as described above.

In a third aspect, as an overview, a high lifetime n-type wafer is subjected to a damage etch process, but the etch terminates with an oxide growth/deposition on the back (and possibly front) surface of the wafer. The oxidation can be a chemical oxidation, UV/ozone oxidation or liquid oxide deposition, etc. The resulting hydrophilic oxide surface(s) can be used to reduce contamination of the wafer, e.g., relative to a hydrophobic surface. Following oxide deposition, the wafer is subjected to a print operation, where both p-type and n-type nano-particles are deposited in an emitter pattern on the back surface of the cell. The Si nano-particles can be deposited by a double screen printer, an inkjet printer, an extrusion printer, or an aerosol jet printer, etc. The wafer is then loaded into an LPCVD furnace for deposition of a thin a-Si layer. The a-Si layer is used to fill in the voids between nano-particles, as described above. Following a-Si deposition, the wafer is subjected to a high temperature anneal to densify the Si nano-particles and a-Si film stack into a polysilicon layer, and to allow for diffusion and electrical activation of the dopants throughout the polysilicon films. After densification, an oxidation step can be performed to grow a thermal oxide on the surface of the wafer. The oxidation can be performed using wet or dry oxidation, or a low-temperature oxidizing agent. With the oxide intact, the wafer can be removed from the LPCVD furnace and subjected to trench masking operations. Following trench masking, the wafer can be subjected to a trench etch (TOXE) and randomized texturing (rantex), which textures the front surface and removes any residual thin polysilicon between the emitters. Subsequent emitter fabrication operations can be further performed following trench formation and rantex operations.

As an example, FIGS. 3A-3F illustrate cross-sectional views of various stages in the fabrication of a solar cell, in accordance with an embodiment of the present invention.

Figure 3A:
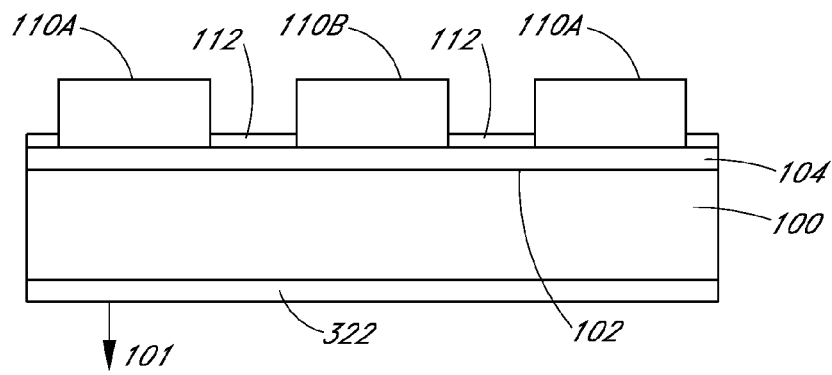
FIGS. 3A-3F illustrate cross-sectional views of various stages in the fabrication of a solar cell, in accordance with another embodiment of the present invention.

Referring to FIG. 3A, a process flow begins essentially with the structure of FIG. 1D, with some noted differences. The doped polycrystalline silicon regions 110A and 110B disposed on a dielectric layer 104, which is disposed on a surface 102 of a substrate 100 are as described in association with FIGS. 1A-1D. Furthermore, portions 112 of the silicon layer 108 remain from the emitter region fabrication process described above. In one embodiment, the polycrystalline silicon regions 110A and 110B are p-type and n-type doped, respectively.

However, in an embodiment, a layer of silicon 322 is formed on the front surface 101 of substrate 100. The layer of silicon 322 can be fabricated in a same process operation as fabrication of layer 108, where compositions and methods of forming are as described above. Thus, referring again to FIG. 2A, a layer of silicon is disposed on both the light-receiving surface 101 (e.g., as layer 322) and on a portion of the thin dielectric layer 104, between the polycrystalline silicon regions 110A and 110B (e.g., as remnant portions 112 of layer 108).

Figure 3B:
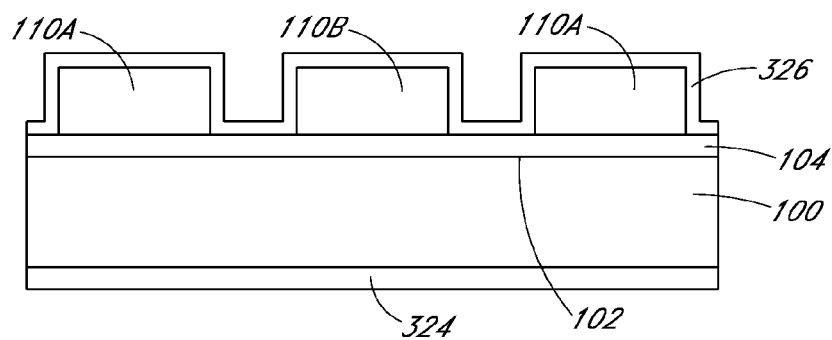

Referring to FIG. 3B, the layer of silicon 322 on the light-receiving surface 101 of the substrate 100, the portion 112 of the layer of silicon 108 on the dielectric layer 104, and an outermost region of the doped polycrystalline silicon regions 110A and 110B are oxidized to form a first silicon oxide layer 324 (which may be silicon dioxide) on the light receiving surface 101 and a second silicon oxide layer 326 (which may be silicon dioxide) above the back surface 102 of the substrate 100. In an embodiment, the silicon oxide layers 324 and 326 are formed by heating the substrate 100 in the presence of oxygen ($O_2$), water vapor ($H_2O$), or nitrous oxide ($N_2O$) in a low pressure chemical vapor deposition (LPCVD) chamber.

Figure 3C:
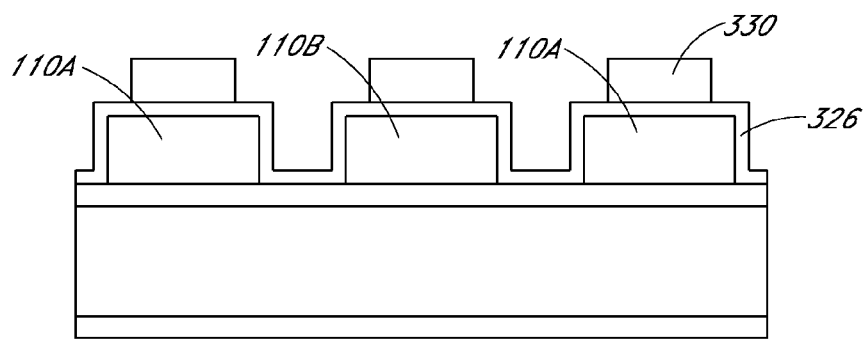

Referring to FIG. 3C, a mask layer 330 is formed above regions of the second silicon oxide layer 326, particular above those regions covering the polycrystalline silicon regions 110A and 110B. In an embodiment, the mask layer 330 is printed directly to have a pattern. In another embodiment, a resist layer is subjected to lithography and development to provide mask layer 330 having a pattern.

Figure 3D:
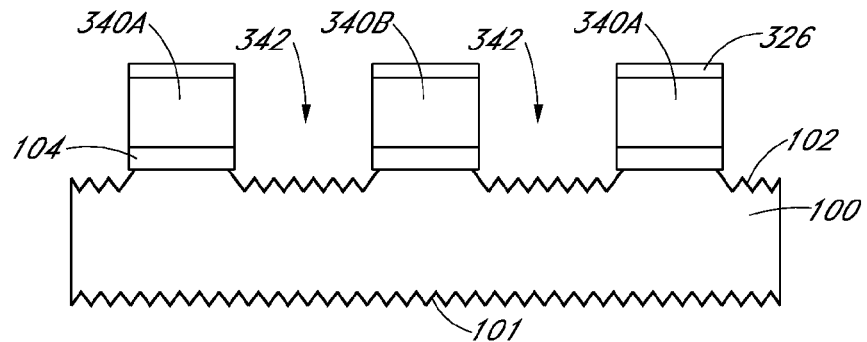

Referring to FIG. 3D, the structure of FIG. 3C is subjected to an etch process to etch the silicon oxide layer 326 and provide N-type doped polysilicon emitter regions 340B and P-type doped polycrystalline silicon emitter regions 340A separated by trenches 342 formed in the back surface 102 of the substrate 100. In an embodiment, the thin dielectric layer 104 is also patterned during the etch process, as depicted in FIG. 3D. Furthermore, in an embodiment, each of the N-type doped polysilicon regions 340B and the P-type doped polycrystalline silicon regions 340A retain a portion of the silicon oxide layer 326 thereon, as is also depicted in FIG. 3D.

Referring again to FIG. 3D, exposed surfaces 101 and 102 of substrate 100 are texturized. A texturized surface may be one which has a regular or an irregular shaped surface for scattering incoming light, decreasing the amount of light reflected off of the light-receiving surface of the solar cell. In one embodiment, the texturized surface is fabricated by etching performed by using a wet etch process such as an alkaline etch based on potassium hydroxide. With respect to the texturized portions at the bottom of the trenches 342, the location of that texturizing can be an artifact of the process operations that are used during the front surface 101 (i.e., light-receiving surface) texture process. It is to be understood that, if needed, the remaining portions of oxide layer 326 may be removed following the texturizing.

Figure 3E:
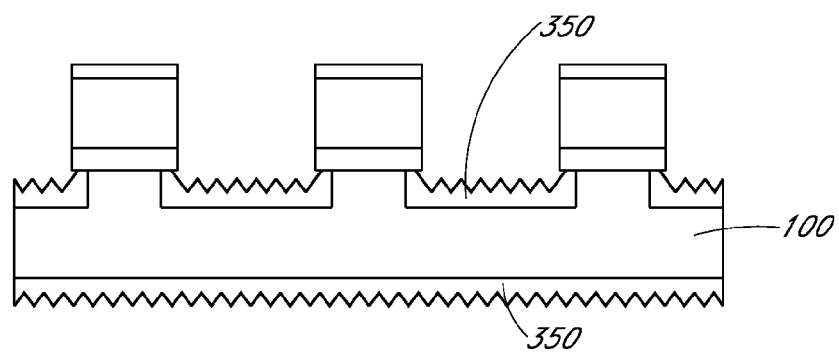

Referring to FIG. 3E, in an embodiment, subsequent to masking and etching the silicon oxide layer 326, N-type dopants are diffused or implanted into the exposed portions of substrate 100, e.g., to form regions 350 having higher concentration n-type dopants within substrate 100. In one such embodiments, the N-type dopants are phosphorus impurity atoms.

Figure 3F:
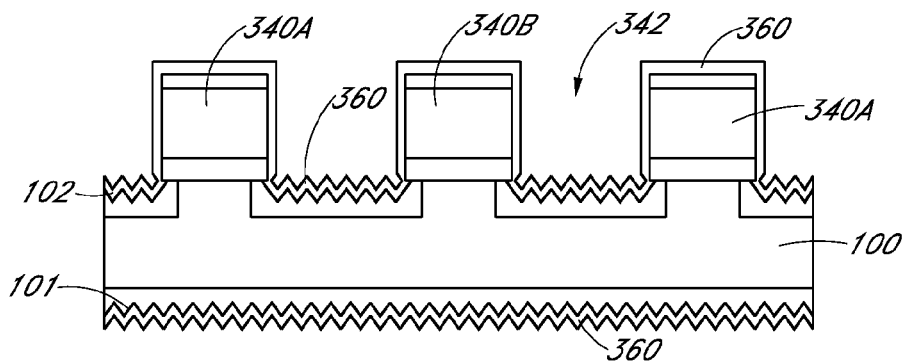

Referring to FIG. 3F, an anti-reflective coating layer 360 is formed on the N-type doped polysilicon regions 340B and the P-type doped polycrystalline silicon regions 340B, in the trenches 342, and on the front surface 101 of the substrate 100. In an embodiment, the anti-reflective coating layer 360 is a silicon nitride layer formed in a low pressure chemical vapor deposition (LPCVD) chamber. In an embodiment, formation of silicon layers 108 (and hence remnants 112) and 322, oxidation of remnants 112 and layer 322, and formation of the anti-reflective coating layer 360 are all performed in a single LPCVD tool, e.g., as a single pass in a chamber of the LPCVD tool. In another embodiment, however, passivation is achieved by using a plasma-enhanced chemical vapor deposition (PECVD)-based silicon nitride (SiNx) layer. In an embodiment (not shown), a metal contact is subsequently formed to the N-type doped polysilicon regions 340B and the P-type doped polycrystalline silicon regions 340A.

In another aspect, it has been found that using a "stitching" network in printed Si nano-particles provides a pathway for solid-state diffusion and under certain conditions causes the film to densify. In another embodiment of the present invention, a low-cost process for fabricating such a network is provided and can enable significant cost reductions with use of Si nano-particles for both polysilicon and substrate based emitter region process flows. More specifically, the use atmospheric pressure chemical vapor deposition (APCVD) is used to deposit films on regions of silicon nanocrystals. APCVD can be an inexpensive approach performed at atmosphere pressures and low temperatures, e.g., less than 500 degrees Celsius. It is to be understood that although a pure Si layer is not generally deposited using APCVD since the precursor molecule, silane, readily reacts with oxygen in the air to form $SiO_2$, extremely low oxygen content Si may not be required to obtain high lifetime polysilicon for the above described stitching layer. The less stringent requirements of purity of the layer formed on regions of nano-crystals can arise since a vast majority of the Si is in the nano-particle layer already deposited on the surface. As a consequence, in one embodiment, APCVD is used to generate a networking film in the Si nano-particle with some minor tool modifications that "seal" the tool from atmosphere and lower the internal oxygen content of the tool during the deposition process. Such modifications can involve, in one embodiment, changing the CDA curtain to an $N_2$ curtain. This can easily be done in the APCVD tool by simply changing the input gas from CDA to $N_2$. The manufacturer estimates that this would create Si with ppm levels of $O_2$. However, a low $O_2$ content in the stitching network is, in an alternative embodiment, much less critical due to the fact that only a stitching network is needed so that the Si particles act as a doping source for the substrate.

Overall, although certain materials are described specifically above, some materials may be readily substituted with others with other such embodiments remaining within the spirit and scope of embodiments of the present invention. For example, in an embodiment, a different material substrate, such as a group III-V material substrate, can be used instead of a silicon substrate.

Thus, methods of fabricating solar cell emitter regions using silicon nano-particles and the resulting solar cells have been disclosed. In accordance with an embodiment of the present invention, a method of fabricating an emitter region of a solar cell includes forming a region of doped silicon nano-particles above a dielectric layer disposed above a surface of a substrate of the solar cell. A layer of silicon is formed on the region of doped silicon nano-particles. At least a portion of the layer of silicon is mixed with at least a portion of the region of doped silicon nano-particles to form a doped polycrystalline silicon layer disposed on the dielectric layer. In one embodiment, the method further includes forming a region of N-type doped silicon nano-particles above the dielectric layer, adjacent to but not in contact with the region of P-type doped silicon nano-particles. The layer of silicon is formed on the region of N-type doped silicon nano-particles. At least a portion of the layer of silicon is mixed with at least a portion of the region of N-type doped silicon nano-particles to form an N-type doped polycrystalline silicon layer disposed on the dielectric layer.

What is claimed is:

1. A method of fabricating an emitter region of a solar cell, the method comprising:
   forming a region of doped silicon nano-particles above a dielectric layer disposed above a surface of a substrate of the solar cell;
   forming a layer of silicon on the region of doped silicon nano-particles; and
   mixing at least a portion of the layer of silicon with at least a portion of the region of doped silicon nano-particles to form a doped polycrystalline silicon layer disposed on the dielectric layer.

2. The method of claim 1, wherein forming the region of doped silicon nano-particles comprises printing or spin-on coating a region of doped silicon nano-particles having an average particles size approximately in the range of 5-100 nanometers and a porosity approximately in the range of 10-50%, with at least some open pores.

3. The method of claim 1, wherein forming the layer of silicon comprises forming a layer of un-doped, intrinsic, or lightly doped amorphous silicon from silane ($SiH_4$) in a low pressure chemical vapor deposition (LPCVD) chamber at a temperature approximately in the range of 525-565 degrees Celsius.

4. The method of claim 1, wherein forming the layer of silicon comprises forming a portion of the silicon layer within the region of doped silicon nano-particles and closing one or more open pores of the region of doped silicon nano-particles with a portion of the layer of silicon.

5. The method of claim 4, wherein closing the one or more open pores of the region of doped silicon nano-particles with the portion of the layer of silicon comprises forming closed pores having angular edges, and wherein mixing the portion of the layer of silicon with the portion of the region of doped silicon nano-particles to form the doped polycrystalline silicon layer comprises modifying the closed pores having angular edges to form rounded closed pores.

6. The method of claim 1, wherein mixing the portion of the layer of silicon with the portion of the region of doped silicon nano-particles to form the doped polycrystalline silicon layer comprises heating the substrate to a temperature approximately in the range of 700-1100 degrees Celsius.

7. The method of claim 1, wherein mixing the portion of the layer of silicon with the portion of the region of doped silicon nano-particles to form the doped polycrystalline silicon layer comprises reducing a combined thickness of the layer of silicon and the region of doped silicon nano-particles by an amount approximately in the range of 20-50%.

8. The method of claim 1, wherein the region of doped silicon nano-particles is formed to a thickness approximately in the range of 0.2-3 microns, and the layer of silicon is formed to an absolute thickness approximately in the range of 200-2000 Angstroms.

9. The method of claim 1, wherein the doped silicon nano-particles are P-type doped silicon nano-particles, and the doped polycrystalline silicon layer is a P-type doped polycrystalline silicon layer.

10. The method of claim 9, further comprising:
forming a region of N-type doped silicon nano-particles above the dielectric layer, adjacent to but not in contact with the region of P-type doped silicon nano-particles;
forming the layer of silicon on the region of N-type doped silicon nano-particles; and
mixing at least a portion of the layer of silicon with at least a portion of the region of N-type doped silicon nano-particles to form an N-type doped polycrystalline silicon layer disposed on the dielectric layer.

11. The method of claim 1, wherein the doped silicon nano-particles are N-type doped silicon nano-particles, and the doped polycrystalline silicon layer is an N-type doped polycrystalline silicon layer.

12. The method of claim 1, wherein the dielectric layer is formed on the substrate and is a tunnel dielectric layer for the emitter region.

13. The method of claim 1, wherein the surface of the substrate is a back surface of the substrate, opposite a light receiving surface of the substrate, the method further comprising:
forming a metal contact on the doped polycrystalline silicon layer.

14. A method of fabricating an emitter region of a solar cell, the method comprising:
forming a region of doped silicon nano-particles above a dielectric layer disposed above a back surface of a substrate of the solar cell, the back surface opposite a light-receiving surface of the solar cell;
forming a layer of silicon on both the light-receiving surface and above the back surface of the substrate, including a portion on the region of doped silicon nano-particles and a portion on the dielectric layer;
mixing the portion of the layer of silicon formed on the region of doped silicon nano-particles with at least a portion of the region of doped silicon nano-particles to form a doped polycrystalline silicon layer disposed on the dielectric layer;
oxidizing the layer of silicon on the light-receiving surface of the substrate, the portion of the layer of silicon on the dielectric layer, and an outermost region of the doped polycrystalline silicon layer to form a silicon oxide layer on the light receiving surface and above the back surface of the substrate;
and forming an anti-reflective coating layer on the silicon oxide layer on the light receiving surface and on the silicon oxide layer above the back surface of the substrate.

15. The method of claim 14, wherein forming the silicon oxide layer on the light receiving surface and above the back surface of the substrate comprises heating the substrate in the presence of oxygen ($O_2$), water vapor ($H_2$), or nitrous oxide ($N_2O$) in a low pressure chemical vapor deposition (LPCVD) chamber.

16. The method of claim 14, wherein forming the anti-reflective coating layer on the silicon oxide layer comprises forming a silicon nitride layer in a low pressure chemical vapor deposition (LPCVD) chamber.

17. The method of claim 14, further comprising:
forming a metal contact to the doped polycrystalline silicon layer.

18. A method of fabricating an emitter region of a solar cell, the method comprising:
forming a region of N-Type doped silicon nano-particles and a region of P-type doped silicon nano-particles above a dielectric layer disposed above a back surface of a substrate of the solar cell, the back surface opposite a light-receiving surface of the solar cell, and the region of N-Type doped silicon nano-particles adjacent to but not in contact with the region of P-type doped silicon nano-particles;
forming a layer of silicon at least above the back surface of the substrate, including a portion on the regions of N-type and P-type doped silicon nano-particles and a portion on the dielectric layer;
mixing the portion of the layer of silicon formed on the regions of N-type and P-type doped silicon nano-particles with at least a portion of each of the regions of N-type and P-type doped silicon nano-particles to form an N-type doped polycrystalline silicon layer and a P-type doped polycrystalline silicon layer, respectively, each disposed on the dielectric layer;
oxidizing the portion of the layer of silicon on the dielectric layer, and an outermost region of the each of the N-type and P-type doped polycrystalline silicon layers to form a silicon oxide layer above the back surface of the substrate;
masking and etching the silicon oxide layer above the back surface of the substrate to provide an N-type doped polysilicon region and a P-type doped polycrystalline silicon region separated by a trench formed in the back surface of the substrate, each of the N-type doped polysilicon region and the P-type doped polycrystalline silicon region retaining a portion of the silicon oxide layer thereon; and
forming an anti-reflective coating layer on the N-type doped polysilicon region and the P-type doped polycrystalline silicon region and in the trench.

19. The method of claim 18, further comprising:
prior to forming the anti-reflective coating layer, texturizing the light-receiving surface.

20. The method of claim 18, further comprising:
subsequent to masking and etching the silicon oxide layer and prior to forming the anti-reflective coating layer, diffusing N-type dopants into the substrate.

* * * * *